 (12) United States Patent
Sio et al.

(10) Patent No.: US 10,971,493 B2
(45) Date of Patent: Apr. 6, 2021

(54) INTEGRATED CIRCUIT DEVICE WITH HIGH MOBILITY AND SYSTEM OF FORMING THE INTEGRATED CIRCUIT

(71) Applicant: TAIWAN SEMICONDUCTOR MANUFACTURING COMPANY LTD., Hsinchu (TW)

(72) Inventors: Kam-Tou Sio, Hsinchu County (TW); Shang-Wei Fang, Hsinchu (TW); Jiann-Tyng Tzeng, Hsinchu (TW); Chew-Yuen Young, Cupertino, CA (US)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 89 days.

(21) Appl. No.: 16/008,111

(22) Filed: Jun. 14, 2018

(65) Prior Publication Data

US 2019/0164962 A1 May 30, 2019

Related U.S. Application Data

(60) Provisional application No. 62/590,888, filed on Nov. 27, 2017.

(51) Int. Cl.
| | |
|---|---|
| *H01L 27/088* | (2006.01) |
| *H01L 23/498* | (2006.01) |
| *H01L 29/78* | (2006.01) |
| *H01L 29/66* | (2006.01) |
| *H01L 29/417* | (2006.01) |
| *H01L 21/8238* | (2006.01) |
| *H01L 27/092* | (2006.01) |

(52) U.S. Cl.
CPC .. *H01L 27/0886* (2013.01); *H01L 21/823821* (2013.01); *H01L 23/49827* (2013.01); *H01L 27/0924* (2013.01); *H01L 29/41791* (2013.01); *H01L 29/66795* (2013.01); *H01L 29/785* (2013.01)

(58) Field of Classification Search
CPC .......................... H01L 27/0886; H01L 29/785
See application file for complete search history.

(56) References Cited

U.S. PATENT DOCUMENTS

| 8,669,615 B1 * | 3/2014 | Chang ................. H01L 27/1211 257/347 |
|---|---|---|
| 8,836,016 B2 | 9/2014 | Wu et al. |
| 8,841,701 B2 | 9/2014 | Lin et al. |

(Continued)

*Primary Examiner* — Eugene Lee
(74) *Attorney, Agent, or Firm* — WPAT, P.C., Intellectual Property Attorneys; Anthony King

(57) ABSTRACT

An integrated circuit device includes: a first fin structure disposed on a substrate in a first direction; a second fin structure disposed on the substrate and aligned in the first direction; a third fin structure disposed on the substrate and aligned in the first direction; a fourth fin structure disposed on the substrate and aligned in the first direction; and a first conductive line aligned in a second direction arranged to wrap a first portion, a second portion, a third portion, and a fourth portion of the first fin structure, the second fin structure, the third fin structure, and the fourth fin structure respectively. A first distance between the first fin structure and the second fin structure is different from a second distance between the third fin structure and the fourth fin structure.

20 Claims, 13 Drawing Sheets

(56) References Cited

U.S. PATENT DOCUMENTS

| | | | |
|---|---|---|---|
| 8,847,293 B2 | 9/2014 | Lee et al. | |
| 8,853,025 B2 | 10/2014 | Zhang et al. | |
| 8,962,400 B2 | 2/2015 | Tsai et al. | |
| 9,076,673 B2* | 7/2015 | Kawa | H01L 27/0207 |
| 9,093,514 B2 | 7/2015 | Tsai et al. | |
| 9,236,267 B2 | 1/2016 | De et al. | |
| 9,245,805 B2 | 1/2016 | Yeh et al. | |
| 9,431,383 B2* | 8/2016 | Baek | H01L 29/785 |
| 9,520,482 B1 | 12/2016 | Chang et al. | |
| 9,576,814 B2 | 2/2017 | Wu et al. | |
| 9,627,379 B1* | 4/2017 | Chang | H01L 27/0886 |
| 2006/0175667 A1* | 8/2006 | Tsuchiaki | H01L 21/823821 |
| | | | 257/391 |
| 2008/0283925 A1* | 11/2008 | Berthold | H01L 21/845 |
| | | | 257/368 |
| 2013/0221491 A1* | 8/2013 | Wann | H01L 21/823431 |
| | | | 257/618 |
| 2013/0334610 A1* | 12/2013 | Moroz | H01L 21/823821 |
| | | | 257/369 |
| 2015/0137308 A1* | 5/2015 | Akarvardar | H01L 27/0886 |
| | | | 257/506 |
| 2017/0170278 A1* | 6/2017 | Peng | H01L 29/1083 |
| 2017/0207126 A1* | 7/2017 | Ching | H01L 29/7848 |
| 2018/0151559 A1 | 5/2018 | Sio et al. | |
| 2019/0157162 A1* | 5/2019 | Chu | H01L 27/0886 |
| 2019/0362981 A1* | 11/2019 | Shen | H01L 21/308 |

* cited by examiner

INTEGRATED CIRCUIT DEVICE WITH HIGH MOBILITY AND SYSTEM OF FORMING THE INTEGRATED CIRCUIT

CROSS-REFERENCE TO RELATED APPLICATION

This application claims the benefit of U.S. Provisional Application No. 62/590,888, filed Nov. 27, 2017.

BACKGROUND

The semiconductor integrated circuit (IC) industry has experienced rapid growth. In the course of IC evolution, functional density (the number of interconnected devices per chip area) has generally increased while geometry size (the smallest component (or line) that can be created using a fabrication process) has decreased. In addition to providing benefits, this scaling down process has increased the complexity of processing and manufacturing ICs.

The behavior of metal-oxide-semiconductor field effect transistors (MOSFETs) in IC may be manipulated by controlled addition of impurities, e.g., dopants. Design considerations may include device speed and power consumption when designing the IC and the electronic devices that may include them. Germanium has recently been studied for implementing germanium-based p-type MOSFETs due to its intrinsically high-hole-mobility.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
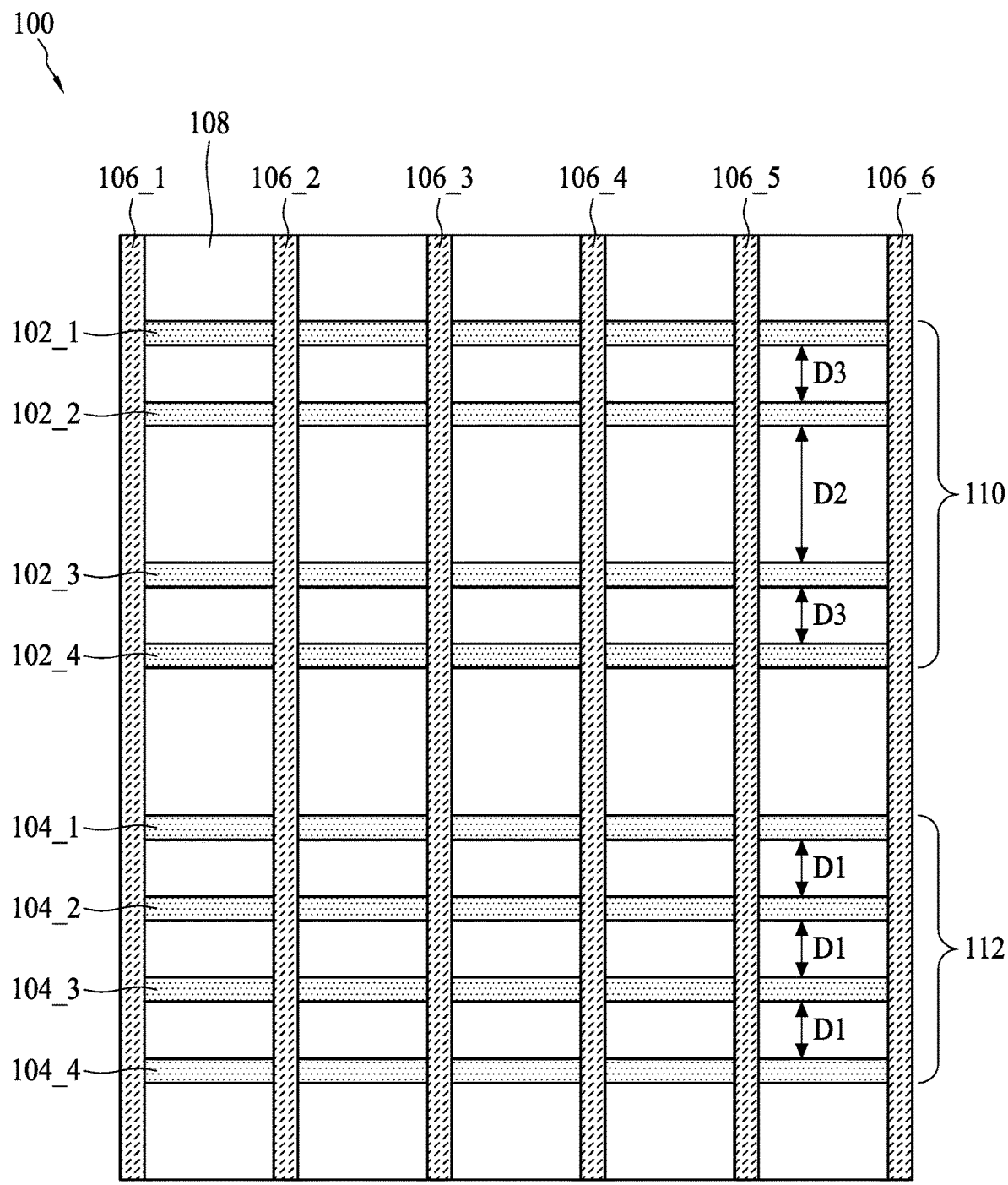
FIG. 1 is a top view of a layout design of an integrated circuit device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Embodiments of the present disclosure are discussed in detail below. It should be appreciated, however, that the present disclosure provides many applicable inventive concepts that can be embodied in a wide variety of specific contexts. The specific embodiments discussed are merely illustrative and do not limit the scope of the disclosure.

Further, spatially relative terms, such as "beneath," "below," "lower," "above," "upper", "lower", "left", "right" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It will be understood that when an element is referred to as being "connected to" or "coupled to" another element, it may be directly connected to or coupled to the other element, or intervening elements may be present.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

FIG. 1 is a top view of a layout design 100 of an integrated circuit (IC) device in accordance with some embodiments. The layout design 100 is arranged to form a plurality of N-channel transistors and a plurality of P-channel transistors. According to some embodiments, the layout design 100 comprises a plurality of first-type fin structures 102_1-102_4, a plurality of second-type fin structures 104_1-104_4, and a plurality of conductive lines 106_1-106_6. The first-type fin structures 102_1-102_4, the second-type fin structures 104_1-104_4, and the conductive lines 106_1-106_6 are formed on a semiconductor substrate 108. The first-type fin structures 102_1-102_4 are disposed in an upper portion 110 of the layout design 100. The second-type fin structures 104_1-104_4 are disposed in a lower portion 112 of the layout design 100.

According to some embodiments, the first-type fin structures 102_1-102_4 are arranged to have impurities of P-type dopant, and the second-type fin structures 104_1-104_4 are arranged to have impurities of N-type dopant. Therefore, the first-type fin structures 102_1-102_4 in combination with the conductive lines 106_1-106_6 may be configured to form one or more P-channel transistors, and the second-type fin structures 104_1-104_4 in combination with the conductive lines 106_1-106_6 may be configured to form one or more N-channel transistors. Moreover, the first-type fin structures 102_1-102_4 are silicon germanium (SiGe) fins. The second-type fin structures 104_1-104_4 are silicon (Si) fins. The SiGe fins doped with P-type dopant have relatively high mobility. For example, the mobility of SiGe fins doped with P-type dopant is higher than the mobility of Si fins doped with P-type dopant.

In this embodiment, four P-type dopant fins are disposed in the upper portion 110, and four N-type dopant fins are disposed in the lower portion 112. However, this is not a limitation of the present embodiment. The number of P-type dopant fins and the number of N-type dopant fins may be adjusted according to the designer's requirement. It is noted that, in other embodiments, the first-type fin structures 102_1-102_4 may be implanted with N-type dopant, and the second-type fin structures 104_1-104_4 may be implanted with P-type dopant.

According to some embodiments, the first-type fin structures 102_1-102_4 and the second-type fin structures 104_1-104_4 are configured to be horizontal lines and the conductive lines 106_1-106_6 are configured to be vertical lines. As shown in FIG. 1, the first-type fin structures 102_1-102_4 and the second-type fin structures 104_1-104_4 extend in a horizontal direction, and the conductive lines 106_1-106_6 extend in a vertical direction. The conductive lines 106_2-106_5 are arranged to wrap portions of the first-type fin structures 102_1-102_4 and the second-type fin structures 104_1-104_4 to control the conductivity of the first-type fin structures 102_1-102_4 and the second-type fin structures 104_1-104_4 respectively. Therefore, the conductive lines 106_2-106_5 are arranged to form the gates of the P-channel transistor and the N-channel transistor. In this embodiment, the conductive lines 106_1 and 106_6 may form the boundaries of the layout design 100.

The second-type fin structures 104_1-104_4 are configured to have equal distance D1 between every two adjacent fin structures in the second-type fin structures 104_1-104_4. However, the first-type fin structures 102_1-102_4 are not configured to have equal distance between every two adjacent fin structures in the first-type fin structures 102_1-102_4. According to the embodiment as shown in FIG. 1, the distance D2 between the fin structures 102_2 and 102_3 is greater than the distance D3 between the fin structures 102_1 and 102_2 or the distance D3 between the fin structures 102_3 and 102_4. In this embodiment, the distance D3 is equal to the distance D1. However, this is not a limitation of the present embodiments. The distance D3 may be different from the distance D1.

In addition, the layout design 100 in FIG. 1 may be used to form IC devices with different operating speeds during the fabrication stage. For an IC device with relatively high operating speed, the power consumption is relatively high. For an IC device with relatively low operating speed, the power consumption is relatively low. According to some embodiments, the layout design 100 is a 4P4N cell, i.e. a layout cell with four P-type fins (i.e. the first-type fin structures 102_1-102_4) and four N-type fins (i.e. the second-type fin structures 104_1-104_4). When the layout design 100 is applied to form a high power IC device, a P-channel transistor with four P-type fins and an N-channel transistor with four N-type fins are activated or enabled. When the layout design 100 is applied to form a low power IC device, a P-channel transistor with less than four (e.g. two) P-type fins and an N-channel transistor with less than four (e.g. two) N-type fins are activated or enabled. It is noted that the above mentioned fin number is not a limitation of the present embodiments.

Figure 2:
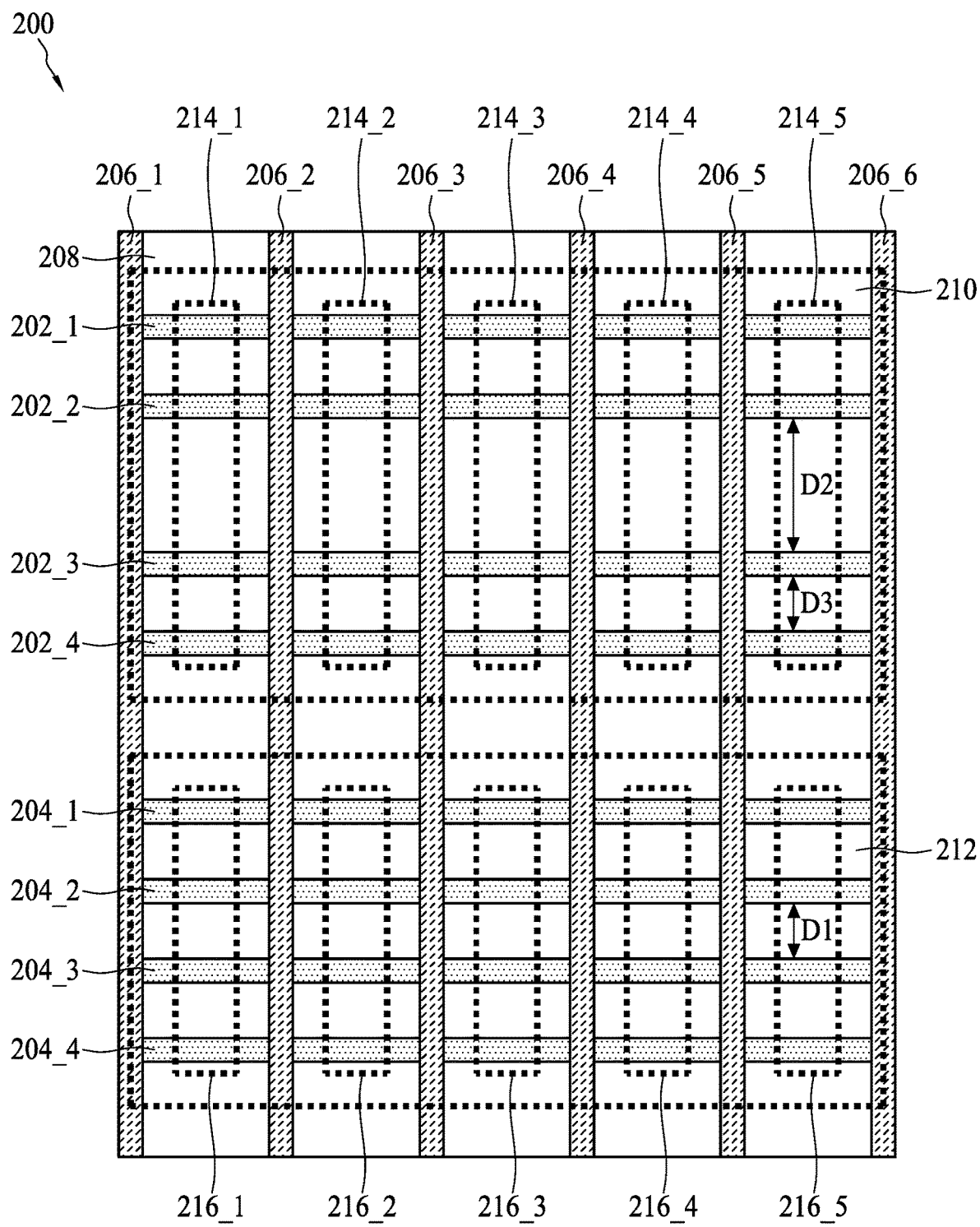
FIG. 2 is a top view of a high power IC device in accordance with some embodiments.

FIG. 2 is a top view of a high power (i.e. high power consumption) IC device 200 in accordance with some embodiments. The IC device 200 may be formed or fabricated according to the layout design 100. For brevity, the IC device 200 comprises a plurality of first-type fin structures 202_1-202_4, a plurality of second-type fin structures 204_1-204_4, and a plurality of conductive lines 206_1-206_6. The first-type fin structures 202_1-202_4, the second-type fin structures 204_1-204_4, and the conductive lines 206_1-206_6 are formed on the semiconductor substrate 208. The first-type fin structures 202_1-202_4 are SiGe fins doped by P-dopant. The second-type fin structures 204_1-204_4 are Si fins doped by N-dopant. The conductive lines 206_1-206_6 are polysilicon lines wrapping the first-type fin structures 202_1-202_4 and the second-type fin structures 204_1-204_4. Therefore, a P-channel transistor 210 and an N-channel transistor 212 are formed on the substrate 208. The P-channel transistor 210 and the N-channel transistor 212 may be Fin Field-effect transistors (FinFET).

According to some embodiments, the portions 214_1-214_5 of the first-type fin structures 202_1-202_4 form the active region (e.g. source/drain) of the P-channel transistor 210. The portions 216_1-216_5 of the second-type fin structures 204_1-204_4 form the active region (e.g. source/drain) of the N-channel transistor 212. Moreover, the upper portions of the conductive lines 206_2-206_5 form a controlling gate of the P-channel transistor 210. The lower portions of the conductive lines 206_2-206_5 form a controlling gate of the N-channel transistor 212. As the conductive lines 206_2-206_5 are electrically connected to the gates of the P-channel transistor 210 and the N-channel transistor 212, the IC device 200 serves as an inverter. However, this is not a limitation of the present embodiments. The IC device 200 may be configured to be any logical circuit depending on the circuit requirement. In addition, for brevity, the metal lines, conductive vias, and contacts used for electrically connecting to the sources, drains, and gates of the P-channel transistor 210 and the N-channel transistor 212 to form the inverter are omitted in FIG. 2.

According to the IC device 200, when all fins (i.e. the first-type fin structures 202_1-202_4) of the P-channel transistor 210 and all fins (i.e. the second-type fin structures 204_1-204_4) of the N-channel transistor 212 are activated or enabled during the operation of the IC device 200, the operating speed (or power consumption) of the IC device 200 is similar to that of the related counterpart of an inverter having equal distance between every two adjacent fin structures. Specifically, although the first-type fin structures 202_1-202_4 of the P-channel transistor 210 are not configured to have equal distance between every two adjacent fin structures, the operating speed (or power consumption) of the P-channel transistor 210 is similar to that of the related counterpart of P-channel transistor having equal distance between every two adjacent fin structures. Accordingly, the performance of the IC device 200 is not affected by the inconsistent distance D2 between the fin structures 202_2 and 202_3.

Figure 3:
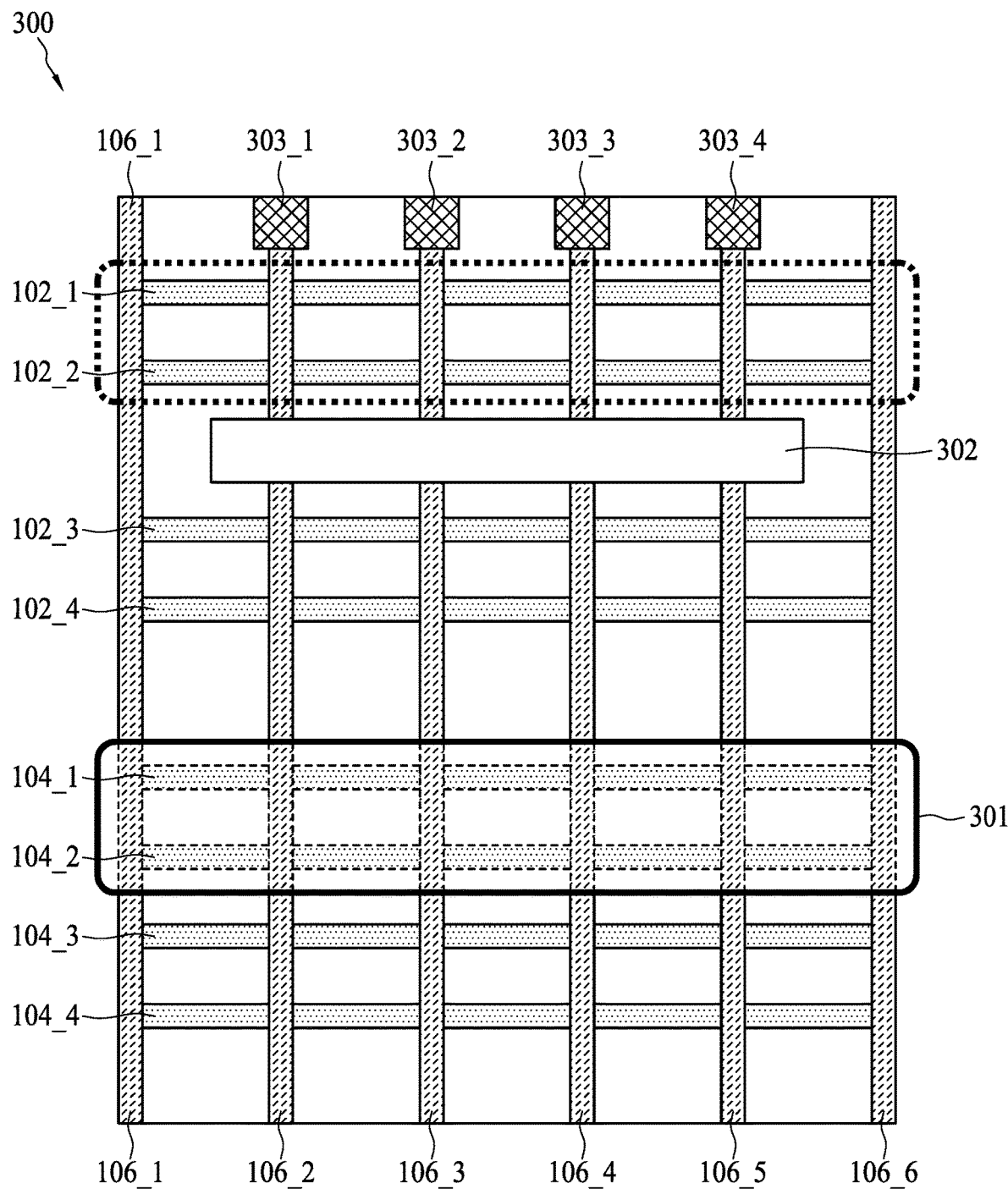
FIG. 3 is a top view of a layout design of a low power IC device during the fabrication stage in accordance with some embodiments.

FIG. 3 is a top view of a layout design 300 corresponding to a low power (i.e. low power consumption) IC device during the fabrication stage in accordance with some embodiments. In comparison to the layout design 100, a fin-cut layer 301 is disposed over the second-type fin structures 104_1-104_2, a gate-cut layer 302 is disposed across the conductive lines 106_2-106_5 on the position between the first-type fin structure 102_2 and 102_3, and a plurality of conductive vias 303_1-303_4, which are simplified as vias in the following paragraphs, are disposed on the top portions of the conductive lines 106_2-106_5 respectively. According to some embodiments, the fin structures covered by the fin-cut layer 301 is omitted during the fabrication stage. When the fin-cut layer 301 is disposed over the second-type fin structures 104_1-104_2, no fin structure is formed in the area covered by the fin-cut layer 401. In addition, the conductive lines covered by the gate-cut layer 402 is omitted during the fabrication stage. When the gate-cut layer 302 is disposed over the conductive lines 106_2-106_5, no conducive line is formed in the area covered by the gate-cut layer 302. Accordingly, the conductive lines 106_2-106_5 are cut into two portions as shown in FIG. 4.

Figure 4:
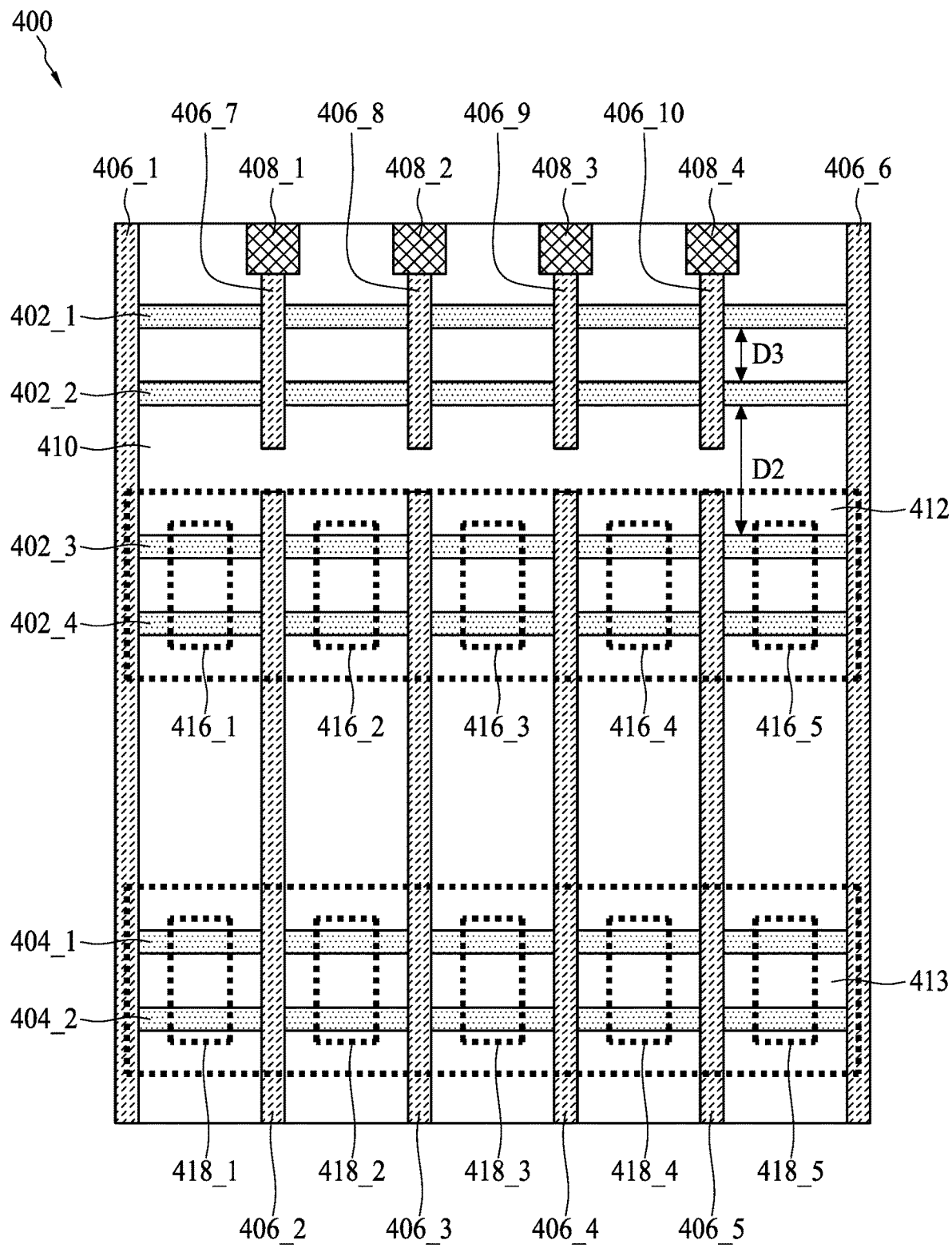
FIG. 4 is a top view of a low power IC device in accordance with some embodiments.

FIG. 4 is a top view of a low power IC device 400 in accordance with some embodiments. The IC device 400 may be formed or fabricated according to the layout design 300. For brevity, the IC device 400 as illustrated comprises a plurality of first-type fin structures 402_1-402_4, a plurality of second-type fin structures 404_1-404_2, a plurality of conductive lines 406_1-406_10, and a plurality of vias 408_1-408_4. The first-type fin structures 402_1-402_4, the second-type fin structures 404_1-404_2, and the conductive lines 406_1-406_10 are formed on a semiconductor substrate 410. The first-type fin structures 402_1-402_4 are SiGe fins doped by P-dopant. The second-type fin structures 404_1-404_2 are Si fins doped by N-dopant. The conductive lines 406_1-406_10 are polysilicon lines wrapping the first-type fin structures 402_3-402_4 and the second-type fin structures 404_1-404_2. Therefore, a P-channel transistor 412 and an N-channel transistor 414 are formed on the substrate 410. The P-channel transistor 412 and the N-channel transistor 414 may be Fin Field-effect transistors (FinFET).

According to some embodiments, the portions 416_1-416_5 of the first-type fin structures 402_3-402_4 form the active region (e.g. source/drain) of the P-channel transistor 412. The portions 418_1-418_5 of the second-type fin structures 404_1-404_2 form the active region (e.g. source/drain) of the N-channel transistor 414. Moreover, the upper portions of the conductive lines 406_2-406_5 form the controlling gate of the P-channel transistor 412. The lower portions of the conductive lines 406_2-406_5 form the controlling gate of the N-channel transistor 414. As the conductive lines 406_2-406_5 are electrically connected to the gates of the P-channel transistor 412 and the N-channel transistor 414, the IC device 400 may be an inverter. However, this is not a limitation of the present embodiments. The IC device 400 may be configured to be any logical circuit depending on the circuit requirement. In addition, for brevity, the metal lines, vias, and contacts used for electrically connecting to the sources, drains, and gates of the P-channel transistor 312 and the N-channel transistor 314 to form the inverter are omitted in FIG. 4.

The conductive lines 406_7-406_10 are disconnected from the conductive lines 406_2-406_5 respectively. The vias 408_1-408_4 are electrically connected to the conductive lines 406-7-406_10 respectively. During the operation of the IC device 400, as the first-type fin structures 402_1-402_2 are doped with P-type dopant, the vias 408_1-408_4 are electrically coupled to a reference voltage, e.g. a supply voltage, to disable the first-type fin structures 402_1-402_2. For the IC device 400, merely two fins (i.e. the first-type fin structures 402_3-402_4) of the P-channel transistor and two fins (i.e. the second-type fin structures 404_1-404_2) of the N-channel transistor are activated or enabled during the operation of the IC device 400. Therefore, the operating speed (or power consumption) of the IC device 400 is lower than the IC device 200.

In addition, although the first-type fin structures 402_1-402_2 are disabled during the operation, the first-type fin structures 402_1-402_2 are still being fabricated in the IC device 400. Therefore, when a high power IC device is formed adjacent to a low power IC device, the fin structures in the high power P-channel transistor and the fin structures in the low power P-channel transistor may be continuous. When the fin structures in the high power P-channel transistor and the low power P-channel transistor are continuous, the stress of the fin structures in the high power P-channel transistor may be maintained. When the stress of the fin structures in the high power P-channel transistor is kept intact, the mobility of the fin structures in the high power P-channel transistor may be maintained as a relatively high mobility.

Figure 5:
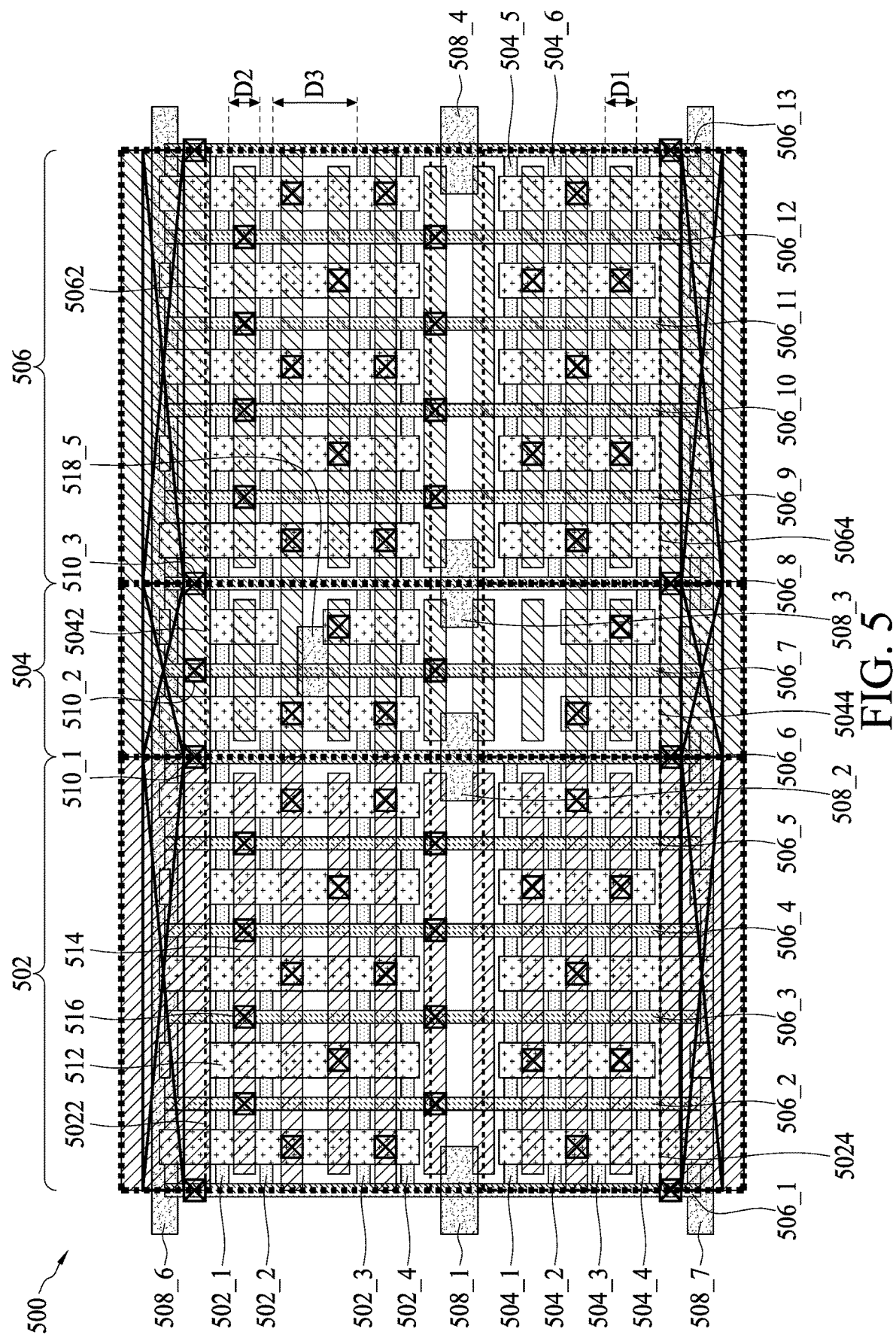
FIG. 5 is a top view of a layout design in accordance with some embodiments.

FIG. 5 is a top view of a layout design 500 in accordance with some embodiments. The layout design 500 is to be fabricated to form an IC device comprising two high power inverters and one low power inverter. Accordingly, the layout design 500 comprises a first high power inverter 502, a low power inverter 504, and a second high power inverter 506. The high power inverter 502, the low power inverter 504, and the second high power inverter 506 are three abutted inverters, in which the low power inverter 504 is disposed between the high power inverters 502 and 506. The layout design 500 comprises a plurality of first-type fin structures 502_1-502_4, a plurality of second-type fin structures 504_1-504_6, and a plurality of conductive lines 506_1-506_13. The first-type fin structures 502_1-502_4 in combination with the conductive lines 506_1-506_6 and the second-type fin structures 504_1-504_4 in combination with the conductive lines 506_1-506_6 are arranged to form a high power P-channel transistor 5022 and a high power N-channel transistor 5024 of the inverter 502 respectively. The first-type fin structures 502_1-502_4 in combination with the conductive lines 506_6-506_8 and the second-type fin structures 504_3-504_4 in combination with the conductive lines 506_6-506_8 are arranged to form a low power P-channel transistor 5042 and a low power N-channel transistor 5044 of the inverter 504 respectively. The first-type fin structures 502_1-502_4 in combination with the conductive lines 506_8-506_13 and the second-type fin structures 504_3-504_6 in combination with the conductive lines 506_8-506_13 are arranged to form a high power P-channel transistor 5062 and a high power N-channel transistor 5064 of the inverter 506 respectively.

The second-type fin structures 504_1-504_4 are configured to have equal distance D1 between every two adjacent fin structures in the second-type fin structures 504_1-504_4. The first-type fin structures 502_1-502_4 are not configured to have equal distance between every two adjacent fin structures in the first-type fin structures 502_1-502_4. According to the embodiment as shown in FIG. 5, the distance D2 between the fin structures 502_2 and 502_3 is greater than the distance D3 between the fin structures 502_1 and 502_2 or the distance D3 between the fin structures 502_3 and 502_4. In this embodiment, the distance D3 is equal to the distance D1. However, this is not a limitation of the present embodiments. The distance D3 may be different from the distance D1.

According to some embodiments, the layout design 500 further comprises a plurality of gate-cut layers 508_1-508_7 and a plurality vias 510_1-510_3. The gate-cut layers 508_1-508_4 are arranged to cut the conductive lines 506_1, 506_5, 506_8, and 506_13 into upper portions and lower portions respectively, in which the upper portions are disposed over the first-type fin structures 502_1-502_4 and the lower portions are disposed over the second-type fin structures 504_1-504_4. The gate-cut layer 508_5 is arranged to cut the conductive line 506_7 into an upper portion and a lower portion, in which the upper portion is disposed over the first-type fin structures 502_1-502_2 and the lower portion is disposed over the second-type fin structures 504_3-504_4. The vias 510_1-510_3 are disposed on the upper portions of the conductive lines 506_6-506_8 respectively. During the operation the IC device, the vias 510_1-510_3 are electrically coupled to a reference voltage, e.g. a supply voltage, to disable the portions of the first-type fin structures 502_1-502_2 in the P-channel transistor 5042. The gate-cut layer 508_6 is arranged to cut or modify the top portions of the conductive lines 506_1-506_13. The gate-cut layer 508_7 is arranged to cut or modify the bottom portions of the conductive lines 506_1-506_13.

During the operation of the IC device formed by the layout design 500, for the inverters 502 and 506, four fins (i.e. the first-type fin structures 502_1-502_4) of the P-channel transistors 5022 and 5062 and four fins (i.e. the second-type fin structures 504_1-504_4 and 504_5-504_6) of the N-channel transistors 5024 and 5064 are activated. For the inverter 504, merely two fins (i.e. the first-type fin structures 502_1-502_4) of the P-channel transistor 5042 and merely two fins (i.e. the second-type fin structures 504_3-504_4) of the N-channel transistor 5044 are activated. Therefore, the power consumption of the inverter 504 is lower than the power consumption of the inverter 502 or 506.

In addition, for the inverter 504, although the portions of the first-type fin structures 502_1-502_2 in the P-channel transistor 5042 are disabled during the operation, these portions are still being fabricated in order to make the first-type fin structures 502_1-502_2 continuous throughout the inverters 502-506. When the first-type fin structures 502_1-502_2 are continuous throughout the inverters 502-506, the stress of the portions of the first-type fin structures 502_1-502_2 in the P-channel transistors 502 and 506 may be maintained. When the stress of the portions of the first-type fin structures 502_1-502_2 in the P-channel transistors 502 and 506 is kept intact, the mobility of the P-dopant in the portions of the first-type fin structures 502_1-502_2 in the P-channel transistors 502 and 506 may be maintained as a relatively high mobility.

It is noted that, in the layout design 500, the second-type fin structures 504_1 and 504_5 and the second-type fin structures 504_2 and 504_6 are not continuous in the horizontal direction. However, this may not affect the mobility of the second-type fin structures 504_1-504_2 and 504_5-504_6 due to the N-type dopant therein.

Moreover, the layout design 500 in FIG. 5 further shows a plurality of contacts (e.g. 512), metal lines (e.g. 514), and conductive vias (e.g. 516) for electrically connecting the inverters 502-504. However, for brevity, not every contacts, metal lines, and conductive vias are not labeled by numerals.

According to the embodiments of FIG. 1-FIG. 5, for the high power IC device, the fin structures of the N-channel transistor are configured to have equal distance between every two adjacent fin structures, and the fin structures of the P-channel transistor are not configured to have equal distance between every two adjacent fin structures. For the low power IC device, the fin structures of the N-channel transistor are configured to be non-continuous, and the fin structures of the P-channel transistor are configured to be continuous. However, these are not the limitations of the present embodiments. The fin configuration in the low power P-channel transistor may be applied to the low power N-channel transistor, and the fin configuration in the low power N-channel transistor may be applied to the low power P-channel transistor.

Figure 6:
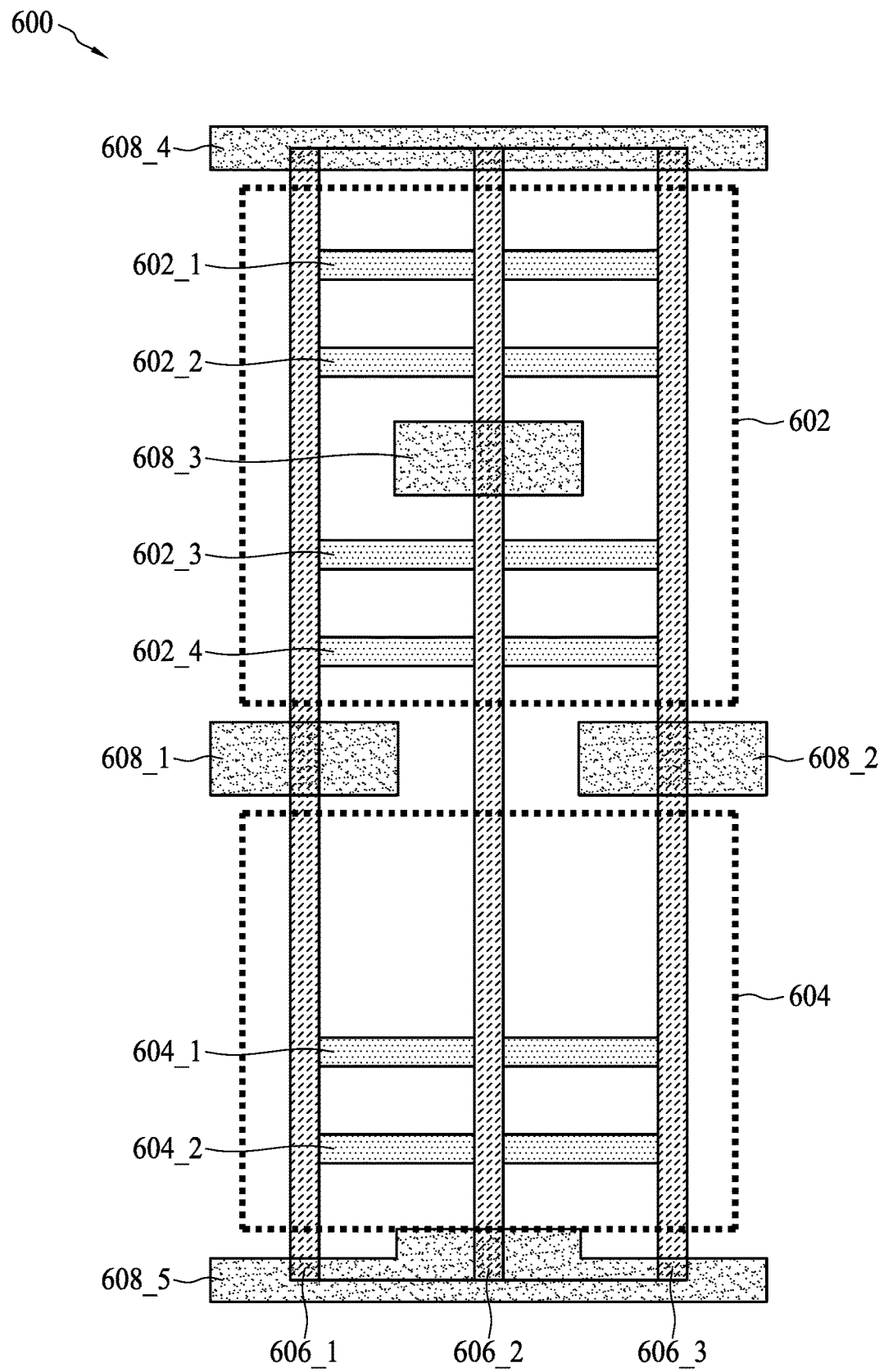
FIG. 6 is a top view of a layout design of a low power IC device during the fabrication stage in accordance with some embodiments.

FIG. 6 is a top view of a layout design 600 corresponding to a low power IC device during the fabrication stage in accordance with some embodiments. The layout design 600 is arranged to form a low power P-channel transistor 602 and a low power N-channel transistor 604. The layout design 600 comprises a plurality of first-type fin structures 602_1-602_4, a plurality of second-type fin structures 604_1-604_2, a plurality of conductive lines 606_1-606_3, and a plurality of gate-cut layers 608_1-608_5. The functions of the first-type fin structures 602_1-602_4, the second-type fin structures 604_1-604_2, the conductive lines 606_1-606_3, and the gate-cut layers 608_1-608_5 are omitted here for brevity. In the embodiment of FIG. 6, the fin configuration of the low power P-channel transistor 602 is similar to the fin configuration of the low power P-channel transistor 5042, and the fin configuration of the low power N-channel transistor 604 is similar to the fin configuration of the low power N-channel transistor 5044. Therefore, the fin structure of the first-type fin structures 602_1-602_4 is continuous in horizontal direction, and the fin structure of the second-type fin structures 604_1-604_2 is non-continuous in horizontal direction.

Figure 7:
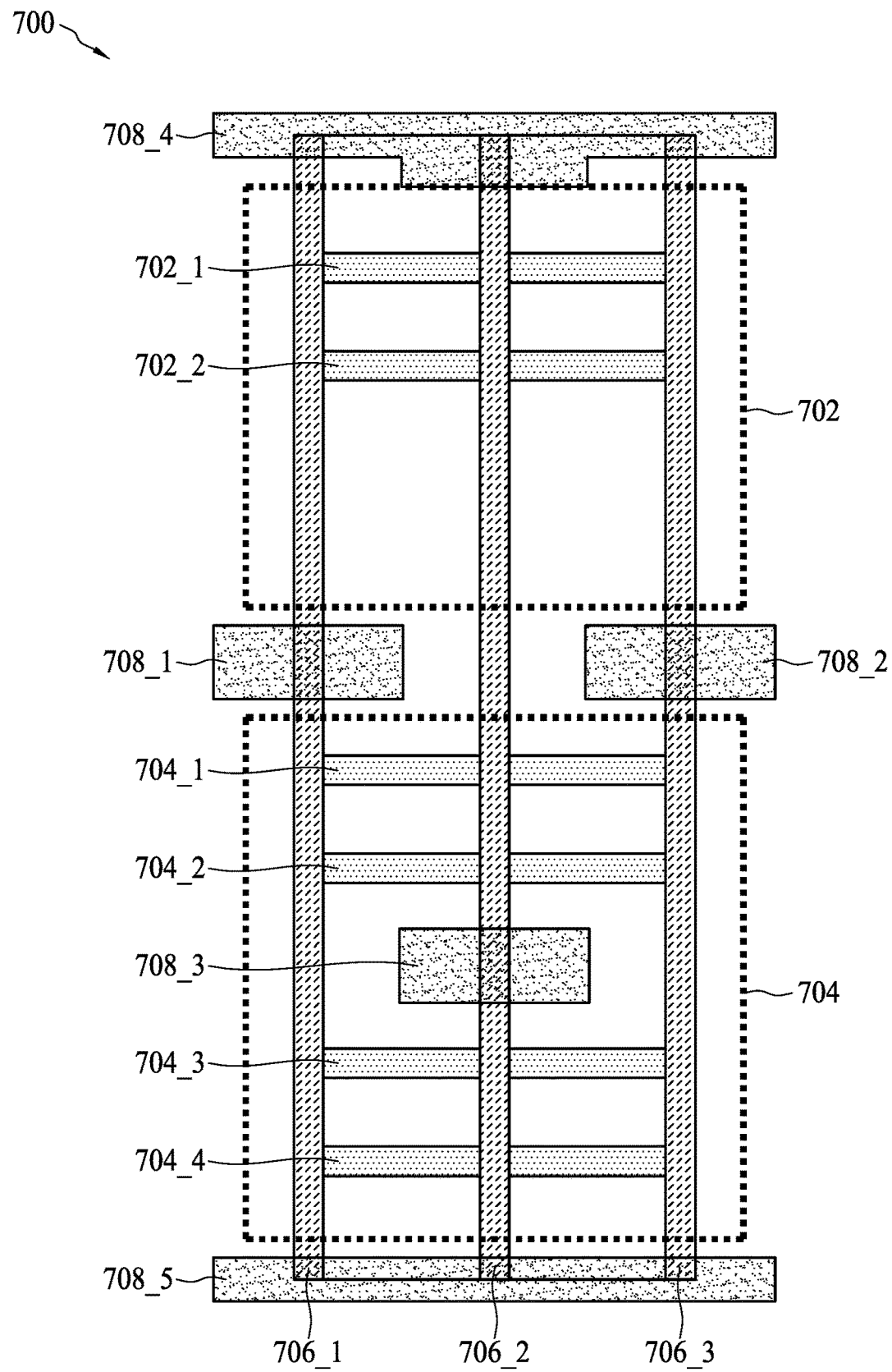
FIG. 7 is a top view of a layout design of a low power IC device during the fabrication stage in accordance with some embodiments.

FIG. 7 is a top view of a layout design 700 corresponding to a low power IC device during the fabrication stage in accordance with some embodiments. The layout design 700 is arranged to form a low power P-channel transistor 702 and a low power N-channel transistor 704. The layout design 700 comprises a plurality of first-type fin structures 702_1-702_2, a plurality of second-type fin structures 704_1-704_4, a plurality of conductive lines 706_1-706_3, and a plurality of gate-cut layers 708_1-708_5. The functions of the first-type fin structures 702_1-702_2, the second-type fin structures 704_1-704_4, the conductive lines 706_1-706_3, and the gate-cut layers 708_1-708_5 are omitted here for brevity. In the embodiment of FIG. 7, the fin configuration of the low power P-channel transistor 702 is similar to the fin configuration of the low power N-channel transistor 5044, and the fin configuration of the low power N-channel transistor 704 is similar to the fin configuration of the low power P-channel transistor 5042. Therefore, the fin structure of the first-type fin structures 702_1-702_2 is not continuous in horizontal direction, and the fin structure of the second-type fin structures 704_1-704_4 is continuous in horizontal direction.

Figure 8:
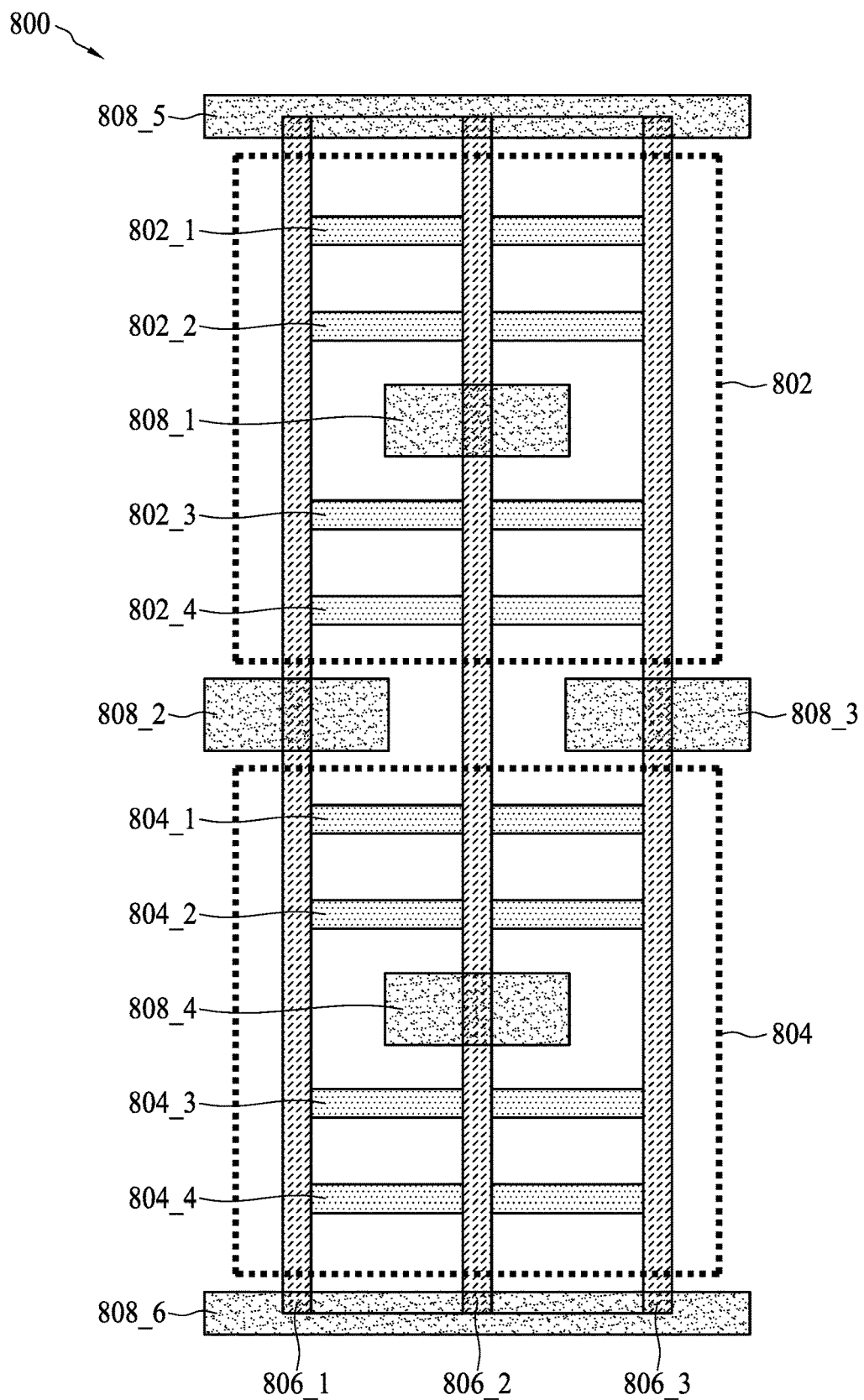
FIG. 8 is a top view of a layout design of a low power IC device during the fabrication stage in accordance with some embodiments.

FIG. 8 is a top view of a layout design 800 corresponding to a low power IC device during the fabrication stage in accordance with some embodiments. The layout design 800 is arranged to form a low power P-channel transistor 802 and a low power N-channel transistor 804. The layout design 800 comprises a plurality of first-type fin structures 802_1-802_4, a plurality of second-type fin structures 804_1-804_4, a plurality of conductive lines 806_1-806_3, and a plurality of gate-cut layers 808_1-808_6. The functions of the first-type fin structures 802_1-802_4, the second-type fin structures 804_1-804_4, the conductive lines 808_1-808_3, and the gate-cut layers 808_1-808_6 are omitted here for brevity. In the embodiment of FIG. 8, the fin configuration of the low power P-channel transistor 802 is similar to the fin configuration of the low power P-channel transistor 5042, and the fin configuration of the low power N-channel transistor 804 is similar to the fin configuration of the low power P-channel transistor 5042. Therefore, the fin structure of the first-type fin structures 802_1-802_4 and the fin structure of the second-type fin structures 804_1-804_4 are continuous in horizontal direction.

Figure 9:
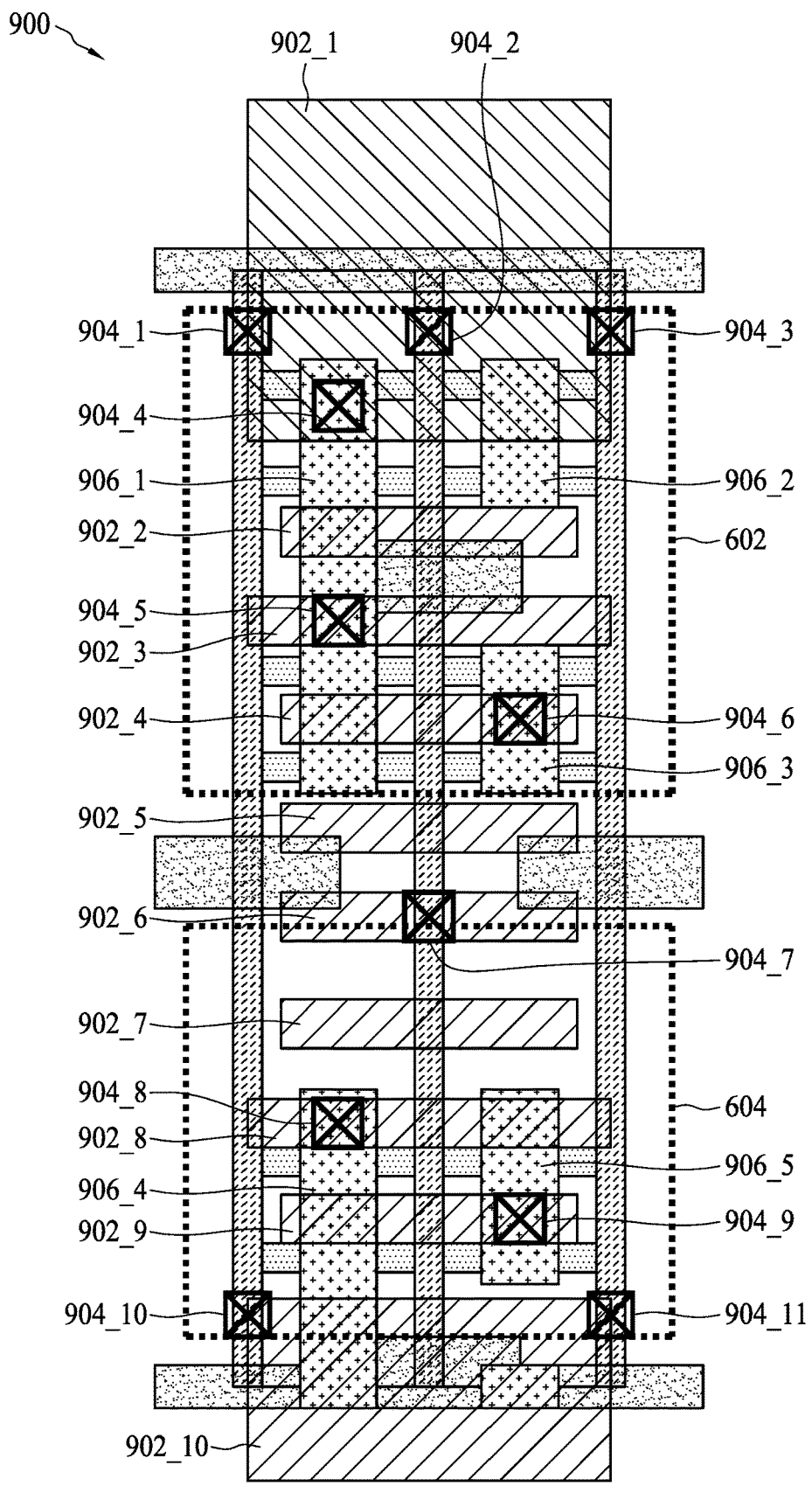
FIG. 9 is a top view of a layout design of a low power inverter during the fabrication stage in accordance with some embodiments.

FIG. 9 is a top view of a layout design 900 corresponding to a low power inverter during the fabrication stage in accordance with some embodiments. The layout design 900 is formed according to the layout design 600. Thus, the similar numerals is omitted in FIG. 9 for brevity. In comparison to the layout design 600, the layout design 900 further comprises a plurality of horizontal metal lines 902_1-902_10, a plurality of vias 904_1-904_11, and a plurality of contacts 906_1-906_5. The vias 904_1-904_3 are disposed on the top portions of the conductive lines 606_1-606_3. The via 904_4 is disposed on the contact 906_1. The via 904_5 is disposed on the contact 906_1. The via 904_6 is disposed on the contact 906_3. The via 904_7 is disposed on the conductive line 606_2. The via 904_8 is disposed on the contact 906_4. The via 904_9 is disposed on the contact 906_5. The vias 904_10-904_11 are disposed on the bottom portions of the conductive lines 606_1 and 606_3 respectively. The metal line 902_1 is disposed on the vias 904_1-904_4. The metal line 902_3 is disposed the vias 904_5. The metal line 902_4 is disposed the vias 904_6. The metal line 902_6 is disposed on the via 904_7. The metal line 902_8 is disposed on the via 904_8. The metal line 902_9 is disposed on the via 904_9. The metal line 902_10 is disposed the vias 904_1 and 904_3. The metal line 902_1 is electrically connected the supply voltage VDD. The metal line 902_8 is electrically connected the ground voltage VSS. As the metal lines 902_1-902_10 are arranged to be horizontal or parallel to the fin structures (e.g. 602_1-602_4 and 604_1-604_2), the metal connection of the layout design 900 is categorized to be horizontal connection.

Figure 10:
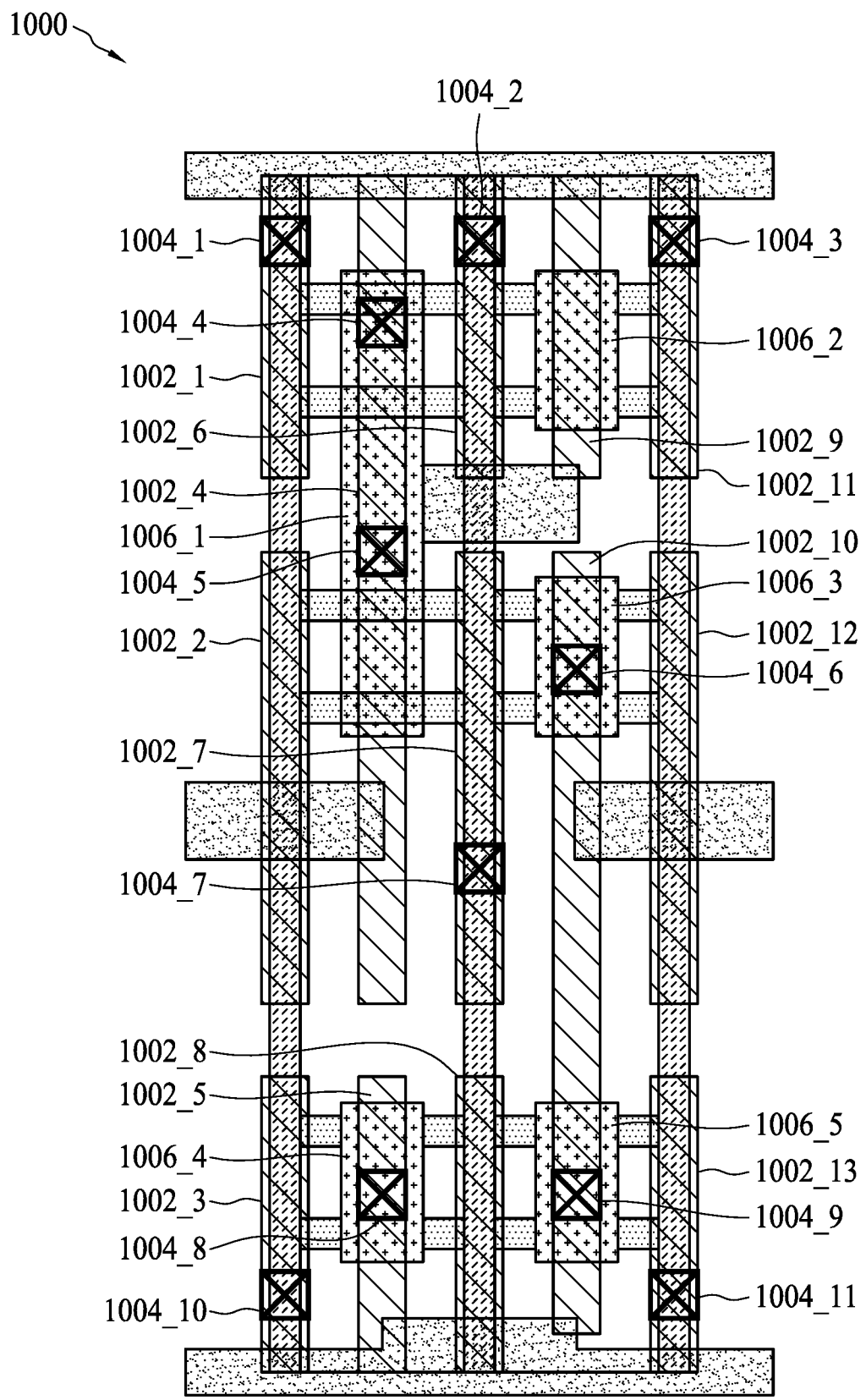
FIG. 10 is a top view of a layout design of a low power inverter during the fabrication stage in accordance with some embodiments.

FIG. 10 is a top view of a layout design 900 corresponding to a low power inverter during the fabrication stage in accordance with some embodiments. The layout design 1000 is formed according to the layout design 600. Thus, the similar numerals is omitted in FIG. 10 for brevity. In comparison to the layout design 600, the layout design 1000 further comprises a plurality of vertical metal lines 1002_1-1002_13, a plurality of vias 1004_1-1004_11, and a plurality of contacts 1006_1-1006_5. The vias 1004_1-1004_3 are disposed on the top portions of the conductive lines 606_1-606_3. The vias 1004_4-1004_5 are disposed on the contact 906_1. The via 1004_6 is disposed on the contact 906_3. The via 1004_7 is disposed on the conductive line 606_2. The via 1004_8 is disposed on the contact 906_4. The via 1004_9 is disposed on the contact 906_5. The vias 1004_10-1004_11 are disposed on the bottom portions of the conductive lines 606_1 and 606_3 respectively. The metal line 1002_1 is disposed on the via 1004_1. The metal line 1002_3 is disposed on the via 1004_10. The metal line 1002_4 is disposed on the vias 1004_4-1004_5. The metal line 1002_5 is disposed on the via 1004_8. The metal line 1002_6 is disposed on the via 1004_2. The metal line 1002_7 is disposed on the via 1004_7. The metal line 1002_10 is disposed on the vias 1004_6-1004_9. The metal line 1002_11 is disposed on the via 1004_3. The metal line 1002_13 is disposed on the via 1004_11. The metal line 1002_3 is electrically connected the supply voltage VDD. The metal line 1002_4 is electrically connected the ground voltage VSS. As the metal lines 1002_1-1002_13 are arranged to be vertical or parallel to the conductive lines (e.g. 606_1-602_3), the metal connection of the layout design 1000 is categorized to be vertical connection.

Figure 11:
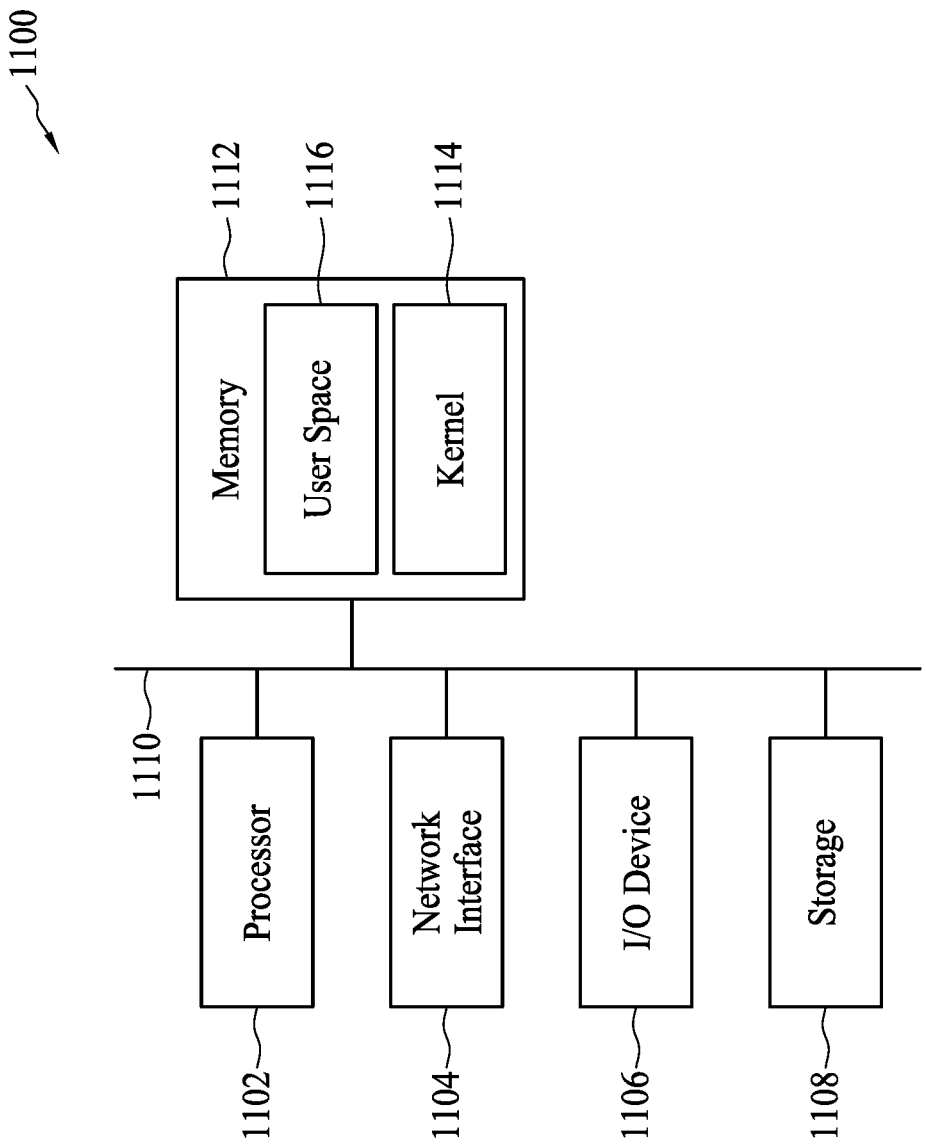
FIG. 11 is a diagram of a hardware system for generating a layout design in accordance with some embodiments.

FIG. 11 is a diagram of a hardware system 1100 for generating the layout designs 100, 300, 500, 600, 700, 800, 900, and/or 1000 in accordance with some embodiments. The system 1100 includes at least one processor 1102, a network interface 1104, an input and output (I/O) device 1106, a storage device 1108, a memory 1112, and a bus 1110. The bus 1110 couples the network interface 1104, the I/O device 1106, the storage device 1108 and the memory 1112 to the processor 1102.

In some embodiments, the memory 1112 comprises a random access memory (RAM) and/or other volatile storage device and/or read only memory (ROM) and/or other non-volatile storage device. The memory 1112 includes a kernel 1114 and user space 1116, configured to store program instructions to be executed by the processor 1102 and data accessed by the program instructions. Briefly, for the example of FIG. 3, the processor is configured to execute program instructions which configure the processor as a processing tool that performs operations comprising: forming the first-type fin structures 102_1-102_4 and the second-type fin structures 104_1-104_4; arranging the conductive lines 106_1-106_6 to wrap over the first-type fin structures 102_1-102_4 and the second-type fin structures 104_1-104_4; disposing the fin-cut layer 301 over the second-type fin structures 104_1-104_2; disposing the gate-cut layer 302 across the conductive lines 106_2-106_5 on the position between the first-type fin structure 102_2 and 102_3; and disposing the plurality of conductive vias 303_1-303_4 on the top portions of the conductive lines 106_2-106_5 respectively.

In some embodiments, the network interface 1104 is configured to access program instructions and data accessed by the program instructions stored remotely through a network. The I/O device 1106 includes an input device and an output device configured for enabling user interaction with the system 1100. The input device comprises, for example, a keyboard, a mouse, etc. The output device comprises, for example, a display, a printer, etc. The storage device 1108 is configured for storing program instructions and data accessed by the program instructions. The storage device 1108 comprises, for example, a magnetic disk and an optical disk.

In some embodiments, when executing the program instructions, the processor 1102 is configured to perform a series of operations to generate the layout designs 100, 300, 500, 600, 700, 800, 900, and/or 1000.

In some embodiments, the program instructions are stored in a non-transitory computer readable recording medium such as one or more optical disks, hard disks and non-volatile memory devices.

Figure 12:
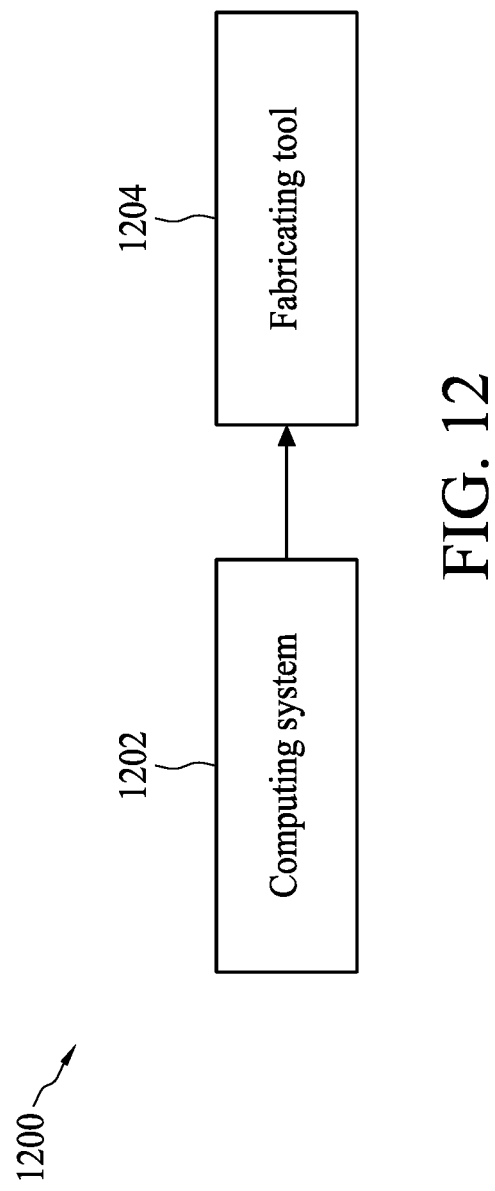
FIG. 12 is a diagram of a system for fabricating an IC device in accordance with some embodiments.

FIG. 12 is a diagram of a system 1200 for fabricating an IC device in accordance with some embodiments. The IC device may be the IC device 200 and/or the IC device 400. The system 1200 comprises a computing system 1202 and a fabricating tool 1204. The computing system 1202 is arranged to perform a series of operations to generate the layout designs 100, 300, 500, 600, 700, 800, 900, and/or 1000. The computing system 1202 may be the above system 1100. The fabricating tool 1204 may be a cluster tool for fabricating an integrated circuit. The cluster tool may be a multiple reaction chamber type composite equipment which includes a polyhedral transfer chamber with a wafer handling robot inserted at the center thereof, a plurality of process chambers positioned at each wall face of the polyhedral transfer chamber; and a loadlock chamber installed at a different wall face of the transfer chamber. At the fabrication stage, at least one photomask is used, for example, for one patterning operation for forming a feature of ICs, such as gate lines of transistors, source or drain regions for the transistors, metal lines for interconnects and vias for the interconnects, on a wafer.

Figure 13:
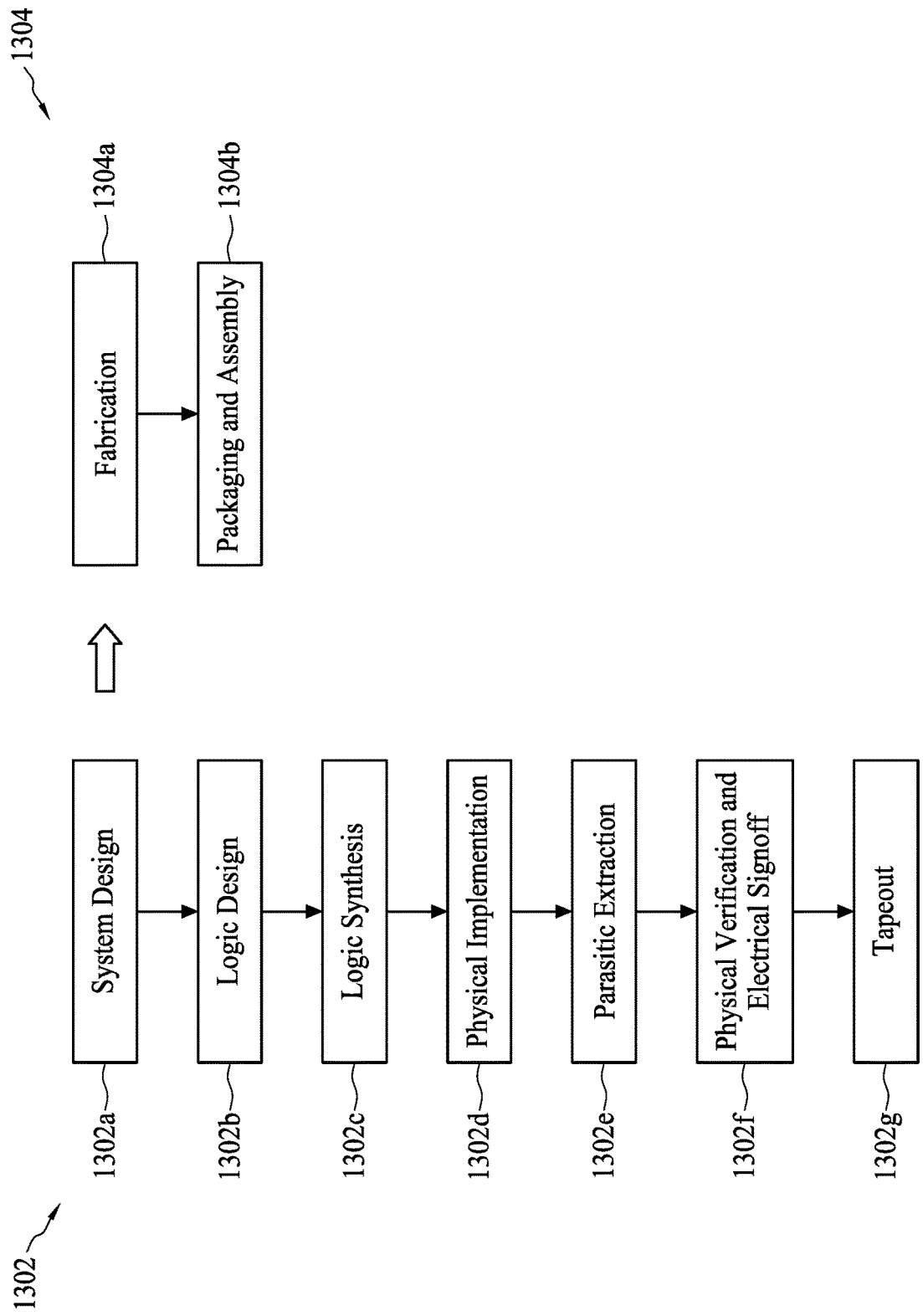
FIG. 13 is a flowchart of a chip design flow and a chip manufacturing flow of an integrated circuit chip in accordance with some embodiments.

FIG. 13 is a flowchart of a chip design flow 1302 and a chip manufacturing flow 1304 of an integrated circuit (IC) chip in accordance with some embodiments. The chip design flow 1302 implements an IC chip design from a high-level specification to a physical layout which is verified for, for example, functionality, performance, and power, and is tapped out for production of masks. One or more electronic design automation (EDA) tools is arranged to carry out one or more stages or operations in the flows of the chip design flow 1202. The chip manufacturing flow 1304 manufactures the IC chip using the masks.

In some embodiments, the chip design flow 1302 includes a system design stage 1302a, a logic design stage 1302b, a logic synthesis stage 1302c, a physical implementation 1302d, a parasitic extraction stage 1302e and a physical verification and electrical signoff stage 1302f, and a tape out stage 1302g.

At the system design stage 1302a, the designer describes the IC chip in terms of larger modules that serve specific functions, respectively. Further, exploration for options include design architectures is performed to consider, for example, tradeoffs in optimizing design specifications and cost.

At the logic design stage 1302b, the modules for the IC chip are described at the register transfer level (RTL) using the VHDL or Verilog, and are verified for functional accuracy.

At the logic synthesis stage 1302c, the modules for the IC chip described in RTL are translated into a gate-level netlist.

At the physical implementation stage 1302d, the gate-level netlist is partitioned into blocks and a floorplan for the blocks is created for a design layout (e.g. 100, 300, 500, 600, 700, 800, 900, and/or 1000). Mapped cells of logic gates and registers in the blocks are placed at specific locations in the design layout. Router-routed interconnects connecting the placed cells are created. In some embodiments, during placement and routing, total wire length, wiring congestion and/or timing are optimized. Using the combined cells facilitates such optimization.

At the parasitic extraction stage 1302e, a physical netlist is extracted from the design layout (e.g. 100, 300, 500, 600, 700, 800, 900, and/or 1000). The physical netlist includes parasitic such as parasitic resistors and capacitors introduced by the interconnects to the cells.

At the physical verification and electrical signoff stage 1302f, timing analysis and post-route optimization are performed on the physical netlist to ensure timing closure. The design layout (e.g. 100, 300, 500, 600, 700, 800, 900, and/or 1000) is checked to ensure clean of, for example, design rule check (DRC) issues, layout versus schematic issues (LVS) and electrical rule check (ERC) issues. Incremental fixing can be performed to achieve electrical signoff of the IC design.

At the tapeout stage 1302g, the design layout (e.g. 100, 300, 500, 600, 700, 800, 900, and/or 1000) is checked to ensure clean of, for example, photolithography issues and is modified using, for example, optical proximity correction (OPC) techniques. For each layer in the final design layout, a corresponding photomask, for example, is created for manufacturing of the IC chip.

In some embodiments, the chip manufacturing flow 1304 includes a fabrication stage 1304a and a packaging and testing stage 1304b.

At the fabrication stage 1304a, the photomask(s) is used, for example, for one patterning operation for forming a feature of ICs, such as gate lines of transistors, source or drain regions for the transistors, metal lines for interconnects and vias for the interconnects, on a wafer.

At the packaging and assembly stage 1304b, ICs (e.g. 200 and/or 400) on the wafer are diced into IC chips and are packaged considering, for example, protection from mechanical damaging, cooling, electromagnetic interference and protection from electrostatic discharge. An IC chip may be assembled with other components for use.

The chip design flow 1302 and the chip manufacturing flow 1304 in FIG. 13 are exemplary. Other sequences of the stages or sequences of operations in the stages, or additional stages or operations before, between or after the stages shown are within the applicable scope of the present disclosure.

Briefly, the present embodiments provides an IC device with different fin spaces in the P-dopant fin structures and/or the N-dopant fin structures. By doing this, the fin structures throughout the IC device may be continuous. When the fin structures throughout the IC device are continuous, the stress of the fin structures may be kept intact, and the mobility of the fin structures may be maintained as a relatively high mobility.

According to some embodiments, an integrated circuit device is provided. The integrated circuit device comprises a first fin structure, a second fin structure, a third fin structure, a fourth fin structure, and a first conductive line. The first fin structure has a first type dopant and is disposed on a substrate and aligned in a first direction. The second fin structure has the first type dopant and is disposed on the substrate and aligned in the first direction, wherein the second fin structure is successively adjacent to the first fin structure. The third fin structure has a second type dopant and is disposed on the substrate and aligned in the first direction. The fourth fin structure has the second type dopant and is disposed on the substrate and aligned in the first direction, wherein the fourth fin structure is successively adjacent to the third fin structure. The first conductive line aligned in a second direction is arranged to wrap a first portion, a second portion, a third portion, and a fourth portion of the first fin structure, the second fin structure, the third fin structure, and the fourth fin structure respectively. The first distance between the first fin structure and the second fin structure is different from a second distance between the third fin structure and the fourth fin structure.

According to some embodiments, an integrated circuit device is provided. The integrated circuit device comprises a first fin structure, a second fin structure, a third fin structure, and a first conductive line. The first fin structure has a first type dopant and is disposed on a substrate and aligned in a first direction. The second fin structure has the first type dopant and is disposed on the substrate and aligned in the first direction, wherein the second fin structure is successively adjacent to the first fin structure. The third fin structure has the first type dopant and is disposed on the substrate and aligned in the first direction, wherein the third fin structure is successively adjacent to the second fin structure. The first conductive line aligned in a second direction is arranged to wrap a first portion, a second portion, and a third portion of the first fin structure, the second fin structure, and the third fin structure respectively. The first distance between the first fin structure and the second fin structure is different from a second distance between the second fin structure and the third fin structure.

According to some embodiments, a system of forming an integrated circuit device is provided. The system comprises at least one processor configured to execute program instructions which configure the at least one processor as a processing tool that performs operations comprising: forming a first fin structure having a first type dopant on a substrate and aligned in a first direction; forming a second fin structure having the first type dopant on the substrate and aligned in the first direction, wherein the second fin structure is successively adjacent to the first fin structure; forming a third fin structure having a second type dopant on the substrate in the first direction; forming a fourth fin structure having the second type dopant on the substrate and aligned in the first direction, wherein the fourth fin structure is successively adjacent to the third fin structure; and arranging a first conductive line, aligned in a second direction, to wrap a first portion, a second portion, a third portion, and a fourth portion of the first fin structure, the second fin structure, the third fin structure, and the fourth fin structure respectively; wherein a first distance between the first fin structure and the second fin structure is different from a second distance between the third fin structure and the fourth fin structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit device, comprising:
   a first fin structure, having a first type dopant, disposed on a substrate and aligned in a first direction;
   a second fin structure, having the first type dopant, disposed on the substrate and aligned in the first direction, wherein the second fin structure is successively adjacent to the first fin structure;
   a third fin structure, having a second type dopant, disposed on the substrate in the first direction;
   a fourth fin structure, having the second type dopant, disposed on the substrate and aligned in the first direction, wherein the fourth fin structure is successively adjacent to the third fin structure;
   a first conductive line, aligned in a second direction, arranged to wrap a first portion of the first fin structure, one end of the first conductive line being located between the first fin structure and the second fin structure; and
   a second conductive line, aligned with the first conductive line in the second direction, arranged to wrap a second portion, a third portion, and a fourth portion of the second fin structure, the third fin structure, and the fourth fin structure respectively, wherein the second conductive line is physically disconnected from the first conductive line in the second direction, one end of the second conductive line is located between the second fin structure and the first fin structure, and the one end of the first conductive line and the one end of the second conductive face each other in the second direction and are separated from each other;
   wherein a first distance between the first fin structure and the second fin structure is different from a second distance between the third fin structure and the fourth fin structure.

2. The integrated circuit device of claim 1, wherein the first distance is greater than the second distance.

3. The integrated circuit device of claim 1, wherein the first type dopant is different from the second type dopant.

4. The integrated circuit device of claim 1, further comprising:
   a conductive via, disposed on the first conductive line.

5. The integrated circuit device of claim 4, wherein the conductive via is electrically coupled a supply voltage.

6. The integrated circuit device of claim 1, further comprising:
   a fifth fin structure having the first type dopant, disposed on the substrate and aligned in the first direction, wherein the fifth fin structure is disposed between the second fin structure and the third fin structure in the first direction.

7. The integrated circuit device of claim 6, wherein the fifth fin structure is successively adjacent to the second fin structure and the third fin structure.

8. An integrated circuit device, comprising:
a first fin structure, having a first type dopant, disposed on a substrate and aligned in a first direction;
a second fin structure, having the first type dopant, disposed on the substrate and aligned in the first direction, wherein the second fin structure is successively adjacent to the first fin structure;
a first conductive line, aligned in a second direction, arranged to wrap a first portion and a second portion of the first fin structure and the second fin structure respectively;
a second conductive line, aligned in the second direction and spaced apart from the first conductive line in the first direction, arranged to wrap a third portion of the first fin structure, one end of the second conductive line being located between the first fin structure and the second fin structure; and
a third conductive line, aligned with the second conductive line in the second direction and spaced apart from the first conductive line in the first direction, arranged to wrap a fourth portion of the second fin structure, one end of the third conductive line being located between the first fin structure and the second fin structure, the one end of the second conductive line and the one end of the third conductive facing each other in the second direction and being separated from each other,
wherein the first portion and the second portion in combination serves as a portion of a first transistor, and wherein the fourth portion except for the third portion serves as a portion of a second transistor.

9. The integrated circuit device of claim 8, further comprising:
a fifth fin structure, having the first type dopant, disposed on the substrate and aligned in the first direction, wherein the fifth structure is successively adjacent to the second fin structure, wherein the first conductive line is further arranged to wrap a fifth portion of the fifth fin structure.

10. The integrated circuit device of claim 8, further comprising:
a third fin structure, having a second type dopant, disposed on the substrate in the first direction;
a fourth fin structure, having the second type dopant, disposed on the substrate and aligned in the first direction, wherein the fourth fin structure is successively adjacent to the third fin structure,
wherein a first distance between the first fin structure and the second fin structure is greater than a second distance between the third fin structure and the fourth fin structure.

11. The integrated circuit device of claim 8, wherein the first type dopant is different from the second type dopant.

12. The integrated circuit device of claim 8, further comprising:
a conductive via, disposed on the second conductive line.

13. The integrated circuit device of claim 8, wherein the second conductive line is disconnected from the third conductive line in the second direction.

14. An integrated circuit device, comprising:
a first fin structure, having a first type dopant, disposed on a substrate and aligned in a first direction;
a second fin structure, having the first type dopant, disposed on the substrate and aligned in the first direction, wherein the second fin structure is successively adjacent to the first fin structure;
a third fin structure, having a second type dopant different from the first type dopant, disposed on the substrate in the first direction;
a fourth fin structure, having the second type dopant, disposed on the substrate and aligned in the first direction, wherein the fourth fin structure is successively adjacent to the third fin structure;
a fifth fin structure, having the first type dopant, disposed on the substrate and aligned in the first direction, wherein the fifth fin structure is successively adjacent to the second fin structure, the first fin structure and the fifth fin structure are located at opposite sides of the second fin structure, and a first distance between the first fin structure and the second fin structure is greater than a second distance between the second fin structure and the fifth fin structure; and
a first conductive line, aligned in a second direction, arranged to wrap a first portion of the first fin structure, a second portion of the second fin structure, a third portion of the third fin structure, a fourth portion of the fourth fin structure, and a fifth portion of the fifth fin structure, respectively;
wherein the first distance between the first fin structure and the second fin structure is different from a third distance between the third fin structure and the fourth fin structure.

15. The integrated circuit device of claim 14, wherein the first distance is greater than the third distance.

16. The integrated circuit device of claim 14, further comprising:
a second conductive line, aligned in the second direction, arranged to wrap a sixth portion of the first fin structure; and
a third conductive line, aligned in the second direction, arranged to wrap a seventh portion of the second fin structure and an eighth portion of the fifth fin structure;
wherein one end of the second conductive line and one end of the third conductive line face each other in the second direction and are separated from each other.

17. The integrated circuit device of claim 16, wherein the second conductive line is electrically coupled a supply voltage.

18. The integrated circuit device of claim 16, further comprising:
a sixth fin structure, having the first type dopant, disposed on the substrate and aligned in the first direction, wherein the sixth fin structure is successively adjacent to the first fin structure, the sixth fin structure and the second fin structure are located at opposite sides of the first fin structure, and the second conductive line is arranged to wrap a ninth portion of the sixth fin structure.

19. The integrated circuit device of claim 18, wherein the first distance between the first fin structure and the second fin structure is greater than a fourth distance between the sixth fin structure and the first fin structure.

20. The integrated circuit device of claim 16, wherein the third conductive line is further arranged to wrap a ninth portion of the third fin structure and a tenth portion of the fourth fin structure.

* * * * *